United States Patent
Asada et al.

(10) Patent No.: US 9,129,949 B2
(45) Date of Patent: Sep. 8, 2015

(54) POWER SEMICONDUCTOR MODULE

(75) Inventors: Shinsuke Asada, Tokyo (JP); Kenjiro Nagao, Tokyo (JP); Dai Nakajima, Tokyo (JP); Yuetsu Watanabe, Tokyo (JP); Yoshihito Asao, Tokyo (JP); Takuya Oga, Tokyo (JP); Masaki Kato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/881,654

(22) PCT Filed: Feb. 9, 2011

(86) PCT No.: PCT/JP2011/052742
§ 371 (c)(1),
(2), (4) Date: Apr. 25, 2013

(87) PCT Pub. No.: WO2012/108011
PCT Pub. Date: Aug. 16, 2012

(65) Prior Publication Data
US 2013/0221516 A1    Aug. 29, 2013

(51) Int. Cl.
*H01L 23/495* (2006.01)
*H01L 23/12* (2006.01)
(Continued)

(52) U.S. Cl.
CPC .......... *H01L 23/49568* (2013.01); *H01L 23/36* (2013.01); *H01L 23/49524* (2013.01);
(Continued)

(58) Field of Classification Search
CPC .............. H01L 23/49568; H01L 45/1253; H01L 45/145; H01L 45/085; H01L 45/146; H01L 45/10; H01L 45/1616; H01L 45/1641

USPC .......... 257/675, 676, 684, 735, 787, E21.504, 257/E23.037, E23.046, E23.052, E23.092; 438/111, 112, 124
See application file for complete search history.

(56) References Cited

U.S. PATENT DOCUMENTS 5,440,169 A    8/1995    Tomita et al.
5,521,429 A *  5/1996    Aono et al. ................. 257/676
(Continued)

FOREIGN PATENT DOCUMENTS

DE    42 30 030 A1    3/1993
DE    44 00 341 A1    7/1994
(Continued)

OTHER PUBLICATIONS

Japanese Office Action dated Mar. 5, 2014 issued in corresponding Japanese Patent Application No. 2012-556694.
(Continued)

*Primary Examiner* — Dao H Nguyen
(74) *Attorney, Agent, or Firm* — Sughrue Mion, PLLC; Richard C. Turner (57) ABSTRACT

A power semiconductor module (100) includes: an electrode plate (2) in which a body portion (2a) and an external connection terminal portion (2b) are integrally formed, and the body portion (2a) is arranged on the same flat surface; a semiconductor chip (1) mounted on one surface (mounting surface) (2c) of the body portion (2a); and a resin package (3) in which the other surface (heat dissipation surface) (2d) of the body portion (2a) is exposed, and the body portion (2a) of the electrode plate (2) and the semiconductor chip (1) are sealed with resin. The heat dissipation surface (2d) is the same surface as the bottom (3a) of the resin package (3); and consequently, heat dissipation properties and reliability are improved and a reduction in size can be achieved.

12 Claims, 12 Drawing Sheets

(51) Int. Cl.
*H01L 23/00* (2006.01)
*H01L 23/36* (2006.01)
*H01L 23/31* (2006.01)

(52) U.S. Cl.
CPC .... *H01L23/49562* (2013.01); *H01L 23/49575* (2013.01); *H01L 24/40* (2013.01); *H01L 24/41* (2013.01); *H01L 24/3107* (2013.01); *H01L 24/05* (2013.01); *H01L 24/06* (2013.01); *H01L 24/29* (2013.01); *H01L 24/45* (2013.01); *H01L 24/48* (2013.01); *H01L 24/73* (2013.01); *H01L 24/83* (2013.01); *H01L 24/84* (2013.01); *H01L 2224/04026* (2013.01); *H01L 2224/04034* (2013.01); *H01L 2224/04042* (2013.01); *H01L 2224/0603* (2013.01); *H01L 2224/06051* (2013.01); *H01L 2224/06181* (2013.01); *H01L 2224/291* (2013.01); *H01L 2224/2919* (2013.01); *H01L 2224/40139* (2013.01); *H01L 2224/40247* (2013.01); *H01L 2224/4103* (2013.01); *H01L 2224/41051* (2013.01); *H01L 2224/45124* (2013.01); *H01L 2224/48139* (2013.01); *H01L 2224/48247* (2013.01); *H01L 2224/73221* (2013.01); *H01L 2224/73263* (2013.01); *H01L 2224/73265* (2013.01); *H01L 2224/83411* (2013.01); *H01L 2224/83455* (2013.01); *H01L 2224/84801* (2013.01); *H01L 2924/01029* (2013.01); *H01L 2924/07802* (2013.01); *H01L 2924/1305* (2013.01); *H01L 2924/1306* (2013.01); *H01L 2924/13055* (2013.01); *H01L 2924/13091* (2013.01)

(56) References Cited

U.S. PATENT DOCUMENTS

| | | | |
|---|---|---|---|
| 5,619,065 A | | 4/1997 | Kim |
| 5,703,399 A | * | 12/1997 | Majumdar et al. ............ 257/723 |
| 5,767,573 A | * | 6/1998 | Noda et al. .................... 257/675 |
| 5,792,676 A | * | 8/1998 | Masumoto et al. ............ 438/111 |
| 5,986,336 A | | 11/1999 | Tomita |
| 6,281,568 B1 | * | 8/2001 | Glenn et al. .................... 257/684 |
| 6,307,272 B1 | * | 10/2001 | Takahashi et al. ............. 257/787 |
| 6,700,194 B2 | | 3/2004 | Nakajima et al. |
| 6,798,044 B2 | * | 9/2004 | Joshi .............................. 257/666 |
| 8,026,589 B1 | * | 9/2011 | Kim et al. ...................... 257/690 |
| 8,093,692 B2 | * | 1/2012 | Obara ............................. 257/668 |
| 2002/0190374 A1 | * | 12/2002 | Nakajima et al. .............. 257/707 |
| 2003/0042403 A1 | * | 3/2003 | Joshi ........................... 250/214.1 |
| 2006/0097366 A1 | | 5/2006 | Sirinorakul et al. |
| 2008/0036057 A1 | * | 2/2008 | Chou et al. ..................... 257/676 |
| 2008/0106160 A1 | | 5/2008 | Yoshinari et al. |
| 2008/0310120 A1 | | 12/2008 | Wallrafen |
| 2009/0096100 A1 | | 4/2009 | Kajiwara et al. |
| 2012/0319259 A1 | * | 12/2012 | Kim et al. ...................... 257/676 |

FOREIGN PATENT DOCUMENTS

| | | |
|---|---|---|
| DE | 197 00 056 A1 | 9/1997 |
| DE | 102004042488 A1 | 3/2006 |
| EP | 1 921 911 A1 | 5/2008 |
| JP | 63-191647 U | 12/1988 |
| JP | 3-51849 U | 5/1991 |
| JP | 06-151657 | 5/1994 |
| JP | 7-7112 A | 1/1995 |
| JP | 2001-144229 A | 5/2001 |
| JP | 2003-7966 A | 1/2003 |
| JP | 2006-5281 A | 1/2006 |
| JP | 2009-94341 A | 4/2009 |
| JP | 3160584 U | 6/2010 |
| TW | M93039 U | 11/2010 |
| TW | M393039 U | 11/2010 |

OTHER PUBLICATIONS

European Search Report for corresponding Application No. 11858254.3 issued Jul. 14, 2014.

* cited by examiner

POWER SEMICONDUCTOR MODULE

CROSS REFERENCE TO RELATED APPLICATIONS

This application is a National Stage of International Application No. PCT/JP2011/052742, filed on Feb. 9, 2011, the contents of all of which are incorporated herein by reference in their entirety.

TECHNICAL FIELD

The present invention relates to power semiconductor modules and, more particularly, relates to a power semiconductor module which constitutes one used by being incorporated in a vehicular rotary electric machine, for example, an inverter circuit and/or relay circuit for use in a rotary electric machine for a vehicular electric power steering system.

BACKGROUND ART

Generally, in a power semiconductor module for use in a vehicular inverter circuit and/or relay circuit, a large current flows and the amount of heat generation is large; and therefore, countermeasures against heat dissipation are required while securing electrical insulation properties.

Consequently, in a conventional semiconductor device of Patent Document 1, there is disclosed that a plurality of semiconductor chips are directly arranged on a conductive heat dissipation substrate and these components are integrally formed inside a resin package by transfer mold molding together with a plurality of external connection electrodes electrically connected to the semiconductor chips (for example, see Patent Document 1). In this case, the resin package on the surface side opposite to the surface of the heat dissipation substrate on which the plurality of the semiconductor chips are arranged is thin; heat emitted from the semiconductor chips passes through the heat dissipation substrate and then further passes through the thin resin package to be dissipated to a heat sink or the like attached to the outside of the power semiconductor module. Incidentally, the power semiconductor module and the heat sink are bonded via heat dissipating insulation adhesive or the like.

PRIOR ART DOCUMENT

Patent Document

[Patent Document 1] Japanese Unexamined Patent Publication No. 2003-7966

SUMMARY OF THE INVENTION

Problems to be Solved by the Invention

However, in the semiconductor device of Patent Document 1, the structure is such that the plurality of the external connection terminals and the heat dissipation substrate, which are individually prepared, are bonded by soldering; and therefore, the semiconductor device is additionally increased by an area required for the bonding. Furthermore, the heat emitted from the semiconductor chips passes through the heat dissipation substrate and then further passes through the resin package with low thermal conductivity; and therefore, it is also disadvantageous from the view point of heat dissipation properties. Accordingly, the area of the heat dissipation substrate needs to be enlarged in order to secure heat dissipation performance; and also from this point of view, a problem exists in that a reduction in size of the semiconductor device is difficult.

The present invention is implemented to solve the foregoing problem, and an object of the present invention is to provide a power semiconductor module which has good heat dissipation properties, can achieve a reduction in size, and is highly reliable.

Means for Solving the Problems

In order to solve the above problems, a power semiconductor module according to claim 1 of the present invention includes: a plurality of electrode plates in each of which an external connection terminal portion and a body portion are integrally formed, and the body portion is arranged on the same flat surface; a semiconductor chip mounted on one surface of the body portion of the electrode plate; and a resin package in which at least a part of the other surface of the body portion of the electrode plate is exposed, and the body portion of the electrode plate and the semiconductor chip are sealed with resin.

Furthermore, in a power semiconductor module according to claim 2 of the present invention, the width of the external connection terminal portion is narrower than the width of the body portion of the electrode plate.

Furthermore, in a power semiconductor module according to claim 3 of the present invention, the exposed surface of the body portion of the electrode plate forms the same surface as the bottom of the resin package on the exposed surface side, and the periphery of a base portion of the external connection terminal portion is covered with resin except for the same surface as the exposed surface of the body portion of the electrode plate.

Furthermore, in a power semiconductor module according to claim 4 of the present invention, the body portion of the electrode plate is formed with a through hole, and the resin of the resin package is also filled in the through hole.

Furthermore, in a power semiconductor module according to claim 5 of the present invention, the exposed surface of the body portion of the electrode plate forms the same surface as the bottom of the resin package on the exposed surface side except for an outer edge portion of the bottom; and the outer edge portion of the bottom of the resin package is formed with a resin protrusion portion continuously or intermittently, and a base portion of the external connection terminal portion passes through the resin protrusion portion.

Furthermore, in a power semiconductor module according to claim 6 of the present invention, the body portion of the electrode plate is formed with through holes, and the resin of the resin package is also filled in the through holes, at least a part of the through holes being formed at a portion where resin of the resin protrusion portion is embedded.

Furthermore, in a power semiconductor module according to claim 7 of the present invention, a part of the body portion of the electrode plate is formed with a claw that is bent on the mounting surface side of the semiconductor chip.

Furthermore, in a power semiconductor module according to claim 8 of the present invention, at least a part of an edge portion on the exposed surface side of the body portion of the electrode plate is formed with a cutout portion that is cut out in a stepwise manner, the cutout portion being filled with the resin of the resin package.

Furthermore, in a power semiconductor module according to claim 9 of the present invention, the power semiconductor module is incorporated in a vehicular rotary electric machine.

Advantageous Effect of the Invention

According to a power semiconductor module of the present invention, a semiconductor chip is mounted on a plurality of electrode plates in each of which an external connection terminal portion and a body portion are integrally formed and the surface (non-mounting surface) of an exposed electrode plate, on which the semiconductor chip is not mounted, is brought into contact with an external heat dissipation unit; and therefore, heat dissipation properties and reliability are improved and a reduction in size can be achieved.

Furthermore, a power semiconductor module of the present invention is capable of achieving a reduction in size, thereby contributing to a reduction in size of a vehicular rotary electric machine which is required for being mounted on a limited space. Besides, even if a force, which peels off an external connection terminal portion from a resin package by vibration in connection with driving and rotation during use, is generated, contact properties are improved; and therefore, the occurrence of failure can be suppressed.

MODE FOR CARRYING OUT THE INVENTION

Hereinafter, power semiconductor modules according to embodiments of the present invention will be described with reference to FIG. 1 to FIG. 12. Incidentally, the power semiconductor modules in the present invention do not limit internal circuit configuration; however, in the following embodiments, description will be made as examples of the power semiconductor modules having a relay circuit that uses a metal oxide semiconductor field effect transistor (MOSFET).

Embodiment 1.

Figure 1:
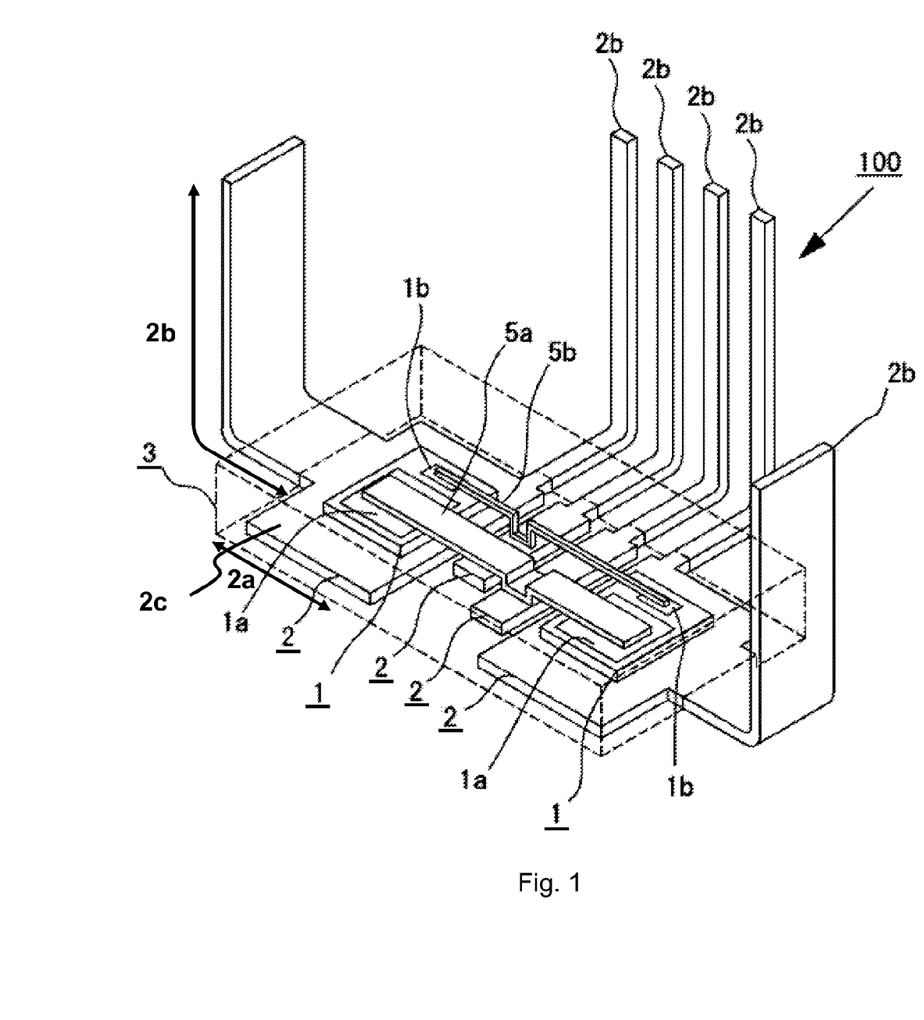
FIG. 1 is a perspective view showing the configuration of a power semiconductor module according to Embodiment 1 of the present invention.
Figure 2:
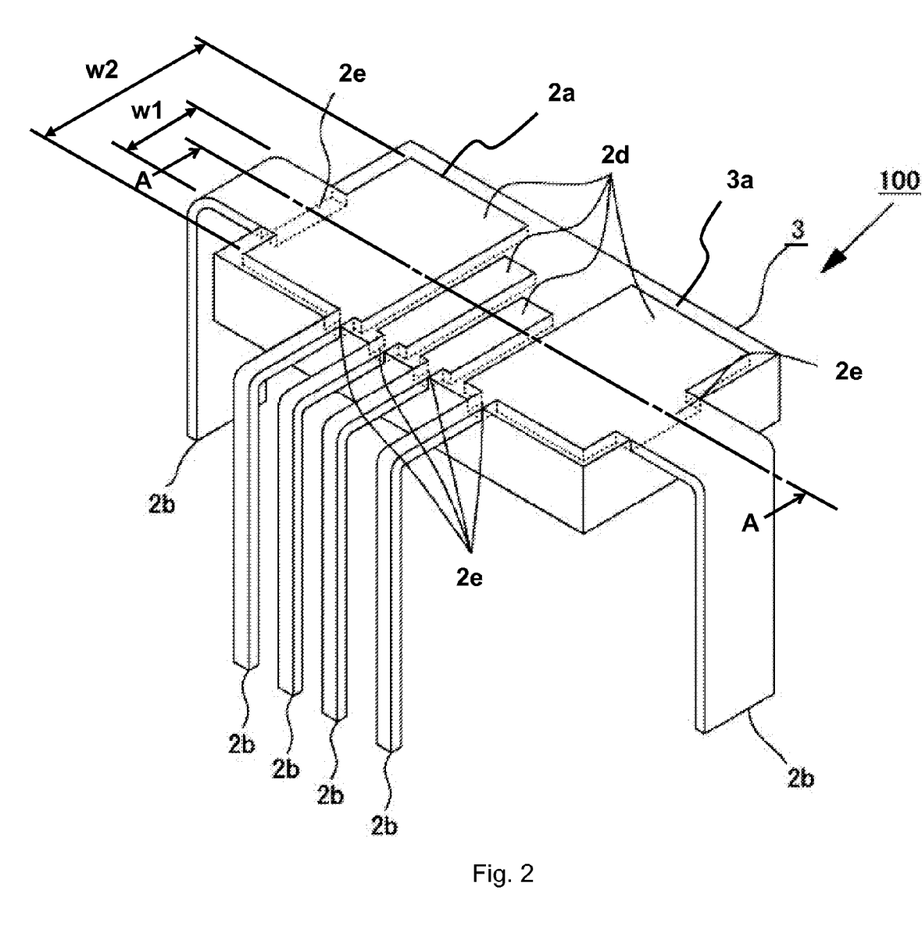
FIG. 2 is a perspective view in which the configuration of the power semiconductor module of FIG. 1 is seen from the bottom.
Figure 3:
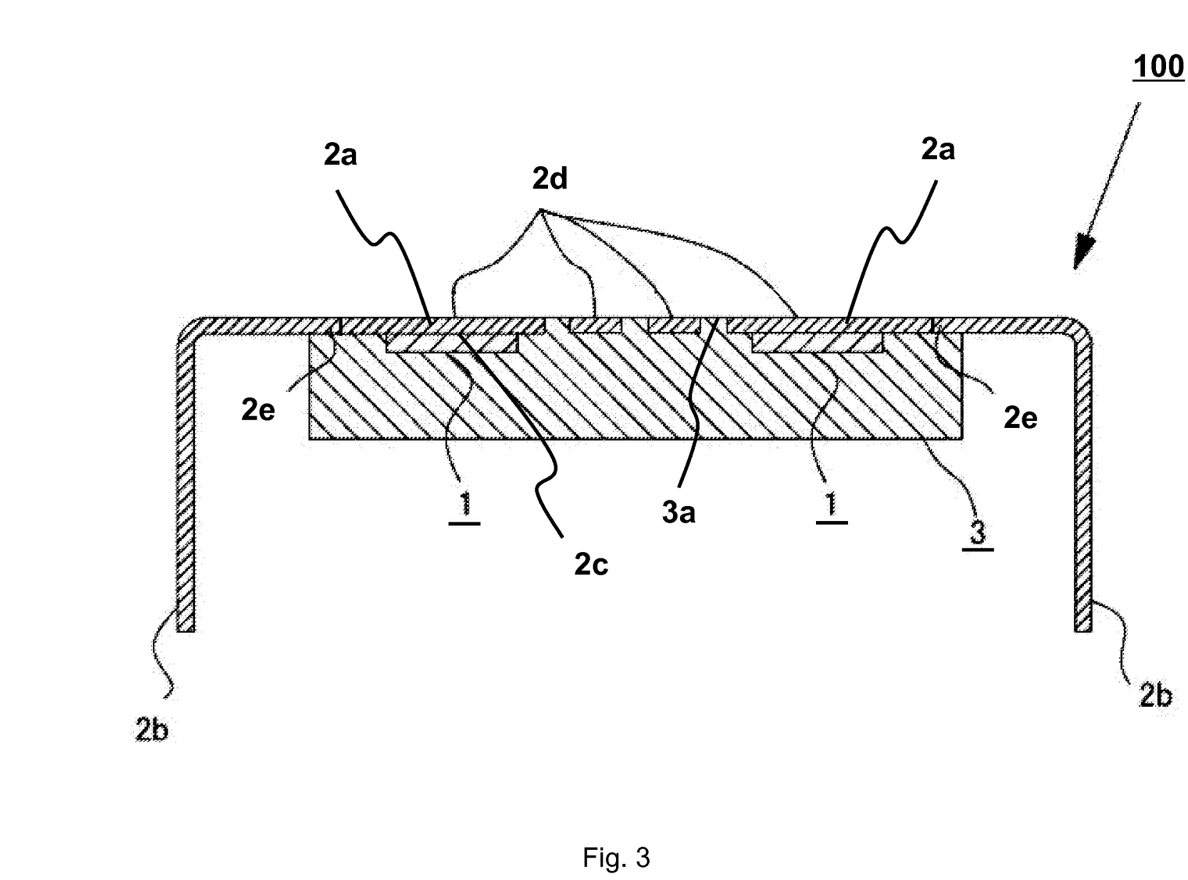
FIG. 3 is a sectional view taken along the line A-A of the power semiconductor module of FIG. 2.
Figure 4:
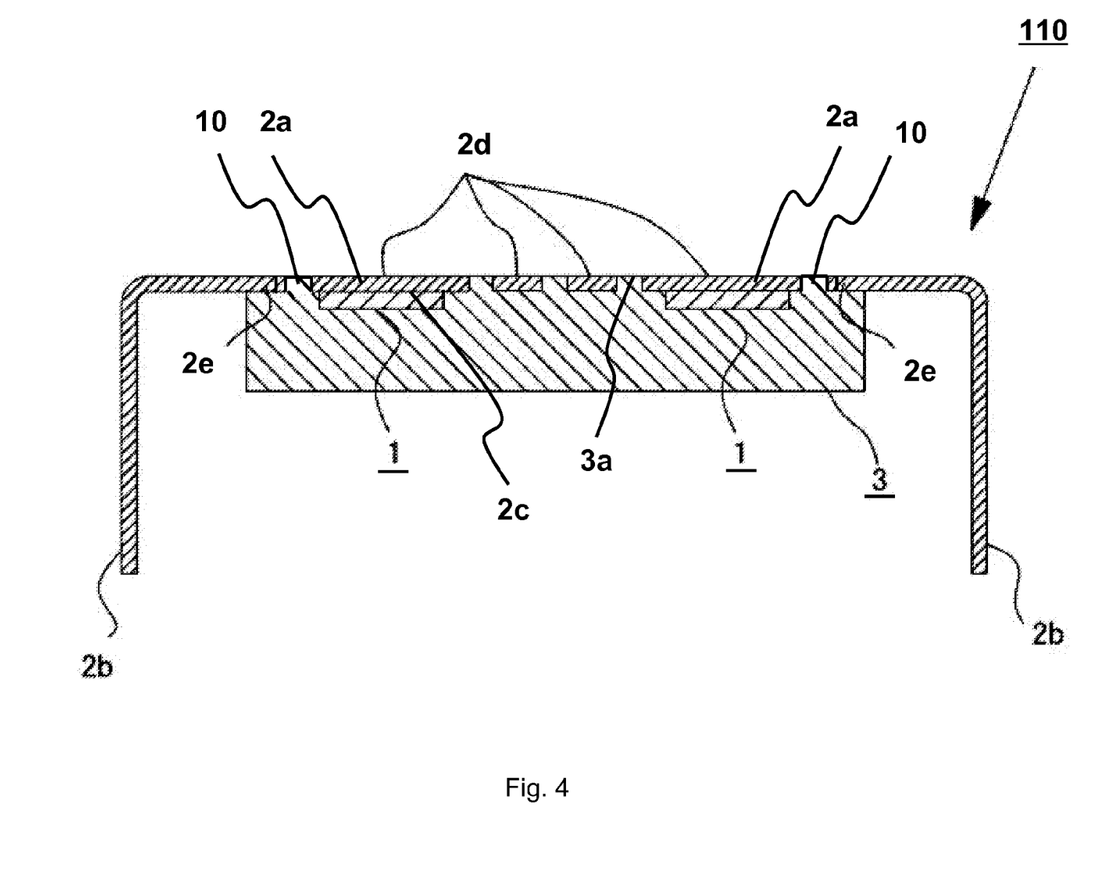
FIG. 4 is a sectional view showing the configuration of a modified example 1 of the power semiconductor module according to Embodiment 1 of the present invention.

FIG. 1 is a perspective view showing the configuration of a power semiconductor module according to Embodiment 1; and FIG. 2 is a perspective view in which the configuration of the power semiconductor module is seen from the bottom. Furthermore, FIG. 3 is a sectional view taken along the line A-A of the power semiconductor module of FIG. 2. In addition, FIG. 4 is a sectional view showing the configuration of a modified example 1 of the power semiconductor module according to Embodiment 1.

As shown in FIG. 1, FIG. 2, and FIG. 3, a power semiconductor module 100 includes: an electrode plate 2 in which a body portion 2a and an external connection terminal portion 2b are integrally formed, and the body portion 2a is arranged on the same flat surface; a semiconductor chip 1 mounted on one surface (mounting surface) 2c of the body portion 2a; and a resin package 3 in which the other surface (heat dissipation surface) 2d of the body portion 2a is exposed, and the body portion 2a of the electrode plate 2 and the semiconductor chip 1 are sealed with resin. The width of the external connection terminal portion 2b is narrower than the width of the body portion 2a of the electrode plate 2. The heat dissipation surface 2d is the same surface as the bottom 3a of the resin package 3 on the heat dissipation surface 2d side. The periphery of a base portion 2e of the external connection terminal portion 2b is covered with resin except for the same surface as the heat dissipation surface 2d.

Next, details and the effects of the configuration of the power semiconductor module according to Embodiment 1 will be described. The semiconductor chip 1 that is a MOSFET chip has a source electrode 1a and a gate electrode 1b on one surface; and on the opposite surface thereof, the semiconductor chip 1 has a drain electrode. The drain electrode of the semiconductor chip 1 is mechanically and electrically connected to the mounting surface 2c of the electrode plate 2 with a conductive connection member (not shown in the drawing) such as solder and conductive adhesive. The electrode plate 2 is made of, for example, metal with good thermal conductivity and electrical conductivity, such as copper alloy; and tin plating processing, nickel plating processing, or the like is appropriately performed completely or partially.

A lead 5a is electrically connected between the respective source electrodes 1a of two semiconductor chips 1. The lead 5a is connected to the source electrode 1a with a connection member (not shown in the drawing), such as solder. Furthermore, an intermediate portion of the lead 5a is electrically connected to the electrode plate 2, on which the semiconductor chip 1 is not mounted, with the connection member such as solder. Similarly, a lead 5b is also connected between the gate electrodes 1b; and an intermediate portion thereof is also electrically connected to a different electrode plate 2 that differs from the electrode plate 2 connected to the lead 5a. Incidentally, this connection may be made with an aluminum wire or the like in place of the lead 5. In the case of the aluminum wire, a well known wire bonding method can be used; and the diameter, the number, and the wire diameter of the aluminum wire are appropriately selected according to allowable current.

The resin package 3 is one in which the semiconductor chips 1, the electrode plates 2, and the leads 5 are sealed with resin such as epoxy resin, as shown in FIG. 1 and FIG. 2. The resin package 3 can be formed by integrally forming the semiconductor chips 1, the electrode plates 2, and the leads 5 as insert members by a well known transfer molding method.

The semiconductor chip 1 and the lead 5 are completely covered with the resin package 3; however, the external connection terminal portion 2b of the electrode plate 2 is drawn to the outside of the resin package 3 except for the base portion 2e. In this case, the external connection terminal portion 2b is bent and raised for being connected to the external device. Connecting means includes various kinds of welding methods, soldering, fastening with bolts, and the like.

As shown in FIG. 2 and FIG. 3, the opposite surface 2d of the mounting surface 2c of the electrode plate 2 mounted with the semiconductor chip 1 is exposed from the resin package 3 to form the heat dissipation surface 2d.

Incidentally, the external connection terminal portion 2b is drawn from the inside of the resin package 3 without being bent. That is, the external connection terminal portion 2b is drawn from the resin package 3 at the same flat surface as the heat dissipation surface 2d; and therefore, the base portion 2e of the external connection terminal portion 2b is in a state where only the same surface as the heat dissipation surface 2d is exposed from the resin package 3, and total three surfaces of the mounting surface 2c mounted with the semiconductor chip 1 and two surfaces of side surfaces thereof are covered with the resin of the resin package 3. The side surfaces of the external connection terminal portion 2b are surfaces formed when the electrode plate 2 is manufactured by blanking and/or etching processing; and therefore, actually, such a surface is not an ideal flat surface as shown in FIG. 1, FIG. 2, and FIG. 3 and there is a case where such the surface is indistinguishable from the mounting surface 2c of the electrode plate 2 and the surface of the heat dissipation surface 2d of the bottom by a shear droop or the like. However, even in this case, a problem does not exist if most of side surface portions are covered with the resin of the resin package 3.

Furthermore, the width w1 of the external connection terminal portion 2b drawn to the outside of the resin package 3 is narrower than the width w2 of the body portion 2a (mounting surface 2c and heat dissipation surface 2d) embedded in the resin package 3. For this reason, even if the external connection terminal portion 2b is pulled when the external connection terminal portion 2b is bonded to a terminal of the external device, a narrowed place becomes a catch; and therefore, peel-off can be prevented.

FIG. 4 shows a sectional view of the configuration of a modified example 1 of the power semiconductor module according to Embodiment 1. In a power semiconductor module 110 of FIG. 4, a through hole 10 is formed in a body portion 2a of an electrode plate 2 in the thickness direction thereof, the body portion 2a being covered with a resin package 3. Furthermore, the resin of the resin package 3 is also embedded inside the through hole 10. An arrangement place and the number of the through holes 10 are not particularly specified; however, the through hole is preferable to be formed near a base portion 2e of an external connection terminal portion 2b.

The resin is embedded in the through hole 10; and therefore, a bite of the electrode plate 2 to the resin package 3 can be enhanced. This makes a bitten part to act as an anchor even when peel-off occurs at the base portion 2e of the external connection terminal portion 2b at the worst; and thus, the development of the peel-off of the electrode plate 2 can be prevented and internal components can be prevented from being damaged.

As described above, in the power semiconductor module of Embodiment 1, the external connection terminal portion and a heat dissipation portion (body portion) are made of the same electrode plate; and therefore, as compared in the case of bonding individually prepared one, an area for bonding can be reduced. Furthermore, the heat dissipation portion is exposed from the resin package; and therefore, the heat emitted from the semiconductor chip can be directly dissipated to the outside without via the resin portion with low thermal conductivity. Consequently, a remarkable effect exists in that there can be obtained a power semiconductor module with a small size and high heat dissipation properties.

Further, the periphery of the base portion of the external connection terminal portion is covered with the resin of the resin package on three surfaces; and therefore, as compared in the case where only one surface is covered with resin, high contact properties between the electrode plate and the resin package can be obtained. At a stage of incorporating the power semiconductor module in the external device, when the external connection terminal portion is joined to the terminal of the external device by means such as welding or screw fastening, the external connection terminal portion and the terminal of the external device are sandwiched; and therefore, the electrode plate is easy to peel off from the resin package at the base portion of the external connection terminal portion by this sandwich load. If high contact properties exist between the resin package and the electrode plate at the base portion, the peel-off can be prevented. As a result, it becomes possible to prevent water from penetrating from the peel-off place to corrode electrodes or the like of the internal semiconductor chip; and internal components such as the semiconductor chip, the lead, and the connection member can be prevented from being damaged in connection with the development of peel-off. Consequently, a highly reliable power semiconductor module can be obtained.

Furthermore, the width of the external connection terminal portion is narrower than that of the body portion and is drawn to the outside of the resin package; and therefore, the narrowed place becomes the catch against the above sandwich load. Consequently, the effect of peel-off prevention can be further enhanced.

Embodiment 2.

Figure 5:
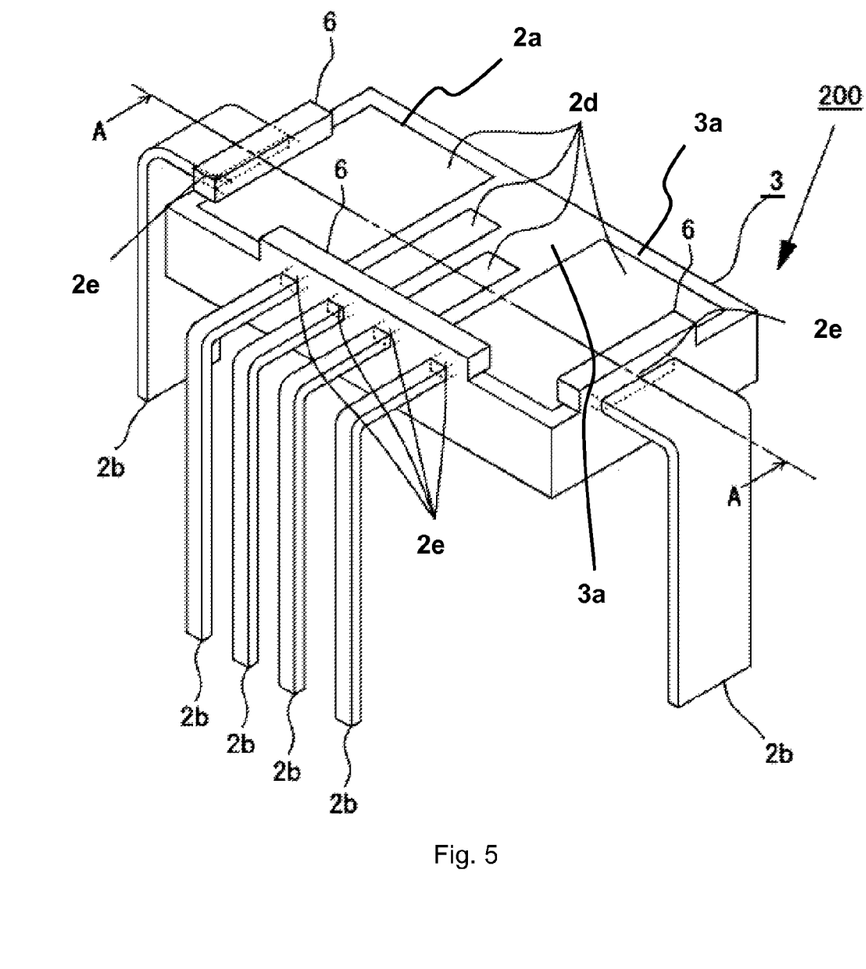
FIG. 5 is a perspective view showing the configuration of a power semiconductor module according to Embodiment 2 of the present invention.
Figure 6:
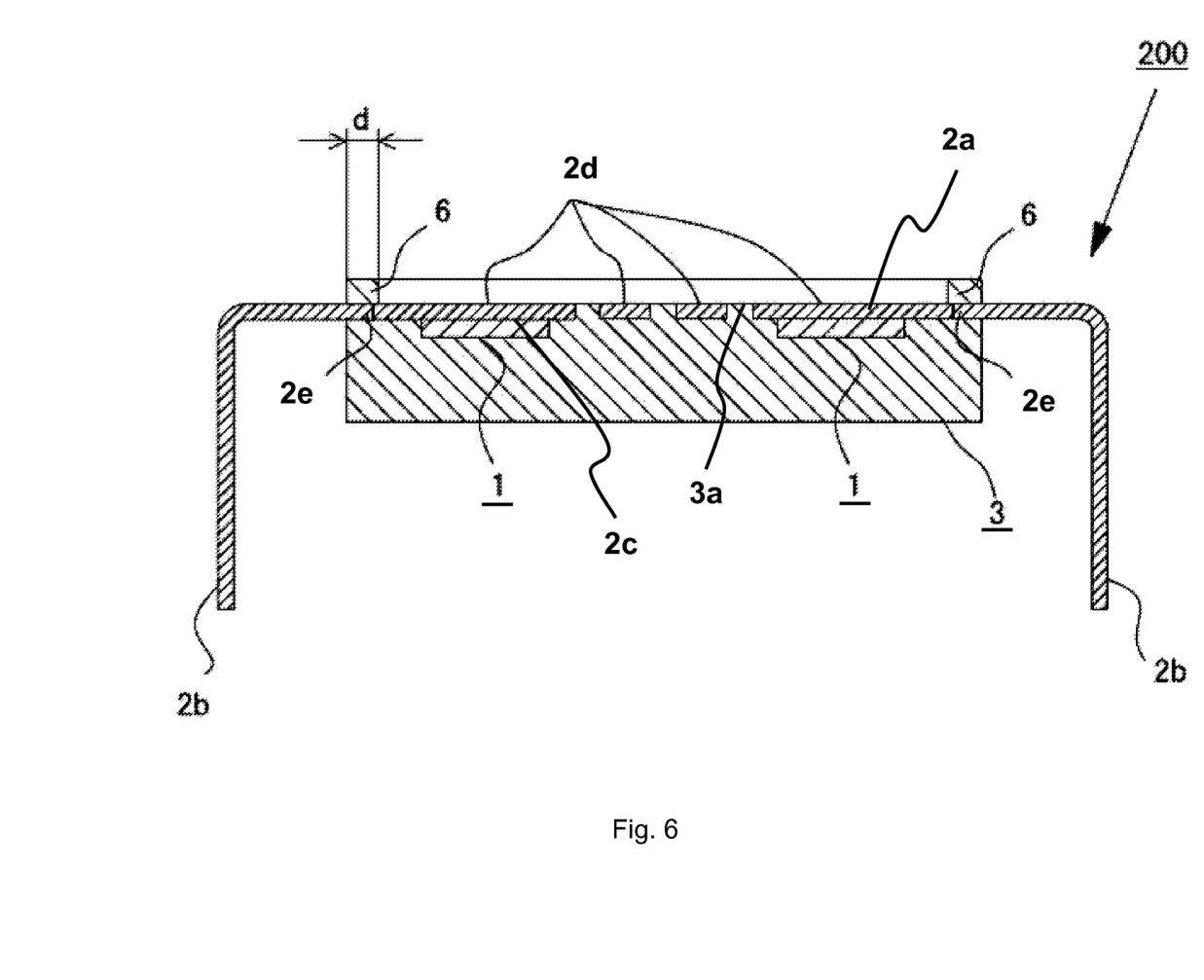
FIG. 6 is a sectional view taken along the line A-A of the power semiconductor module of FIG. 5.
Figure 7:
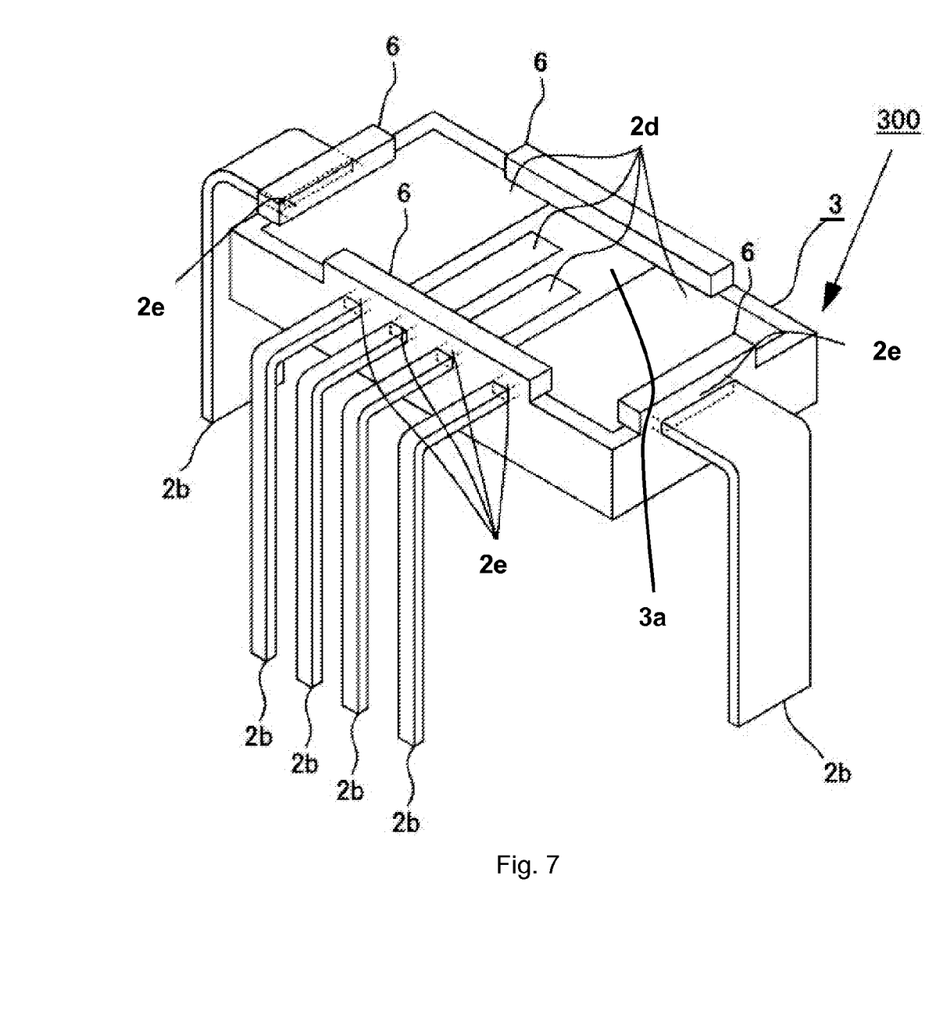
FIG. 7 is a perspective view showing the configuration of a modified example 1 of the power semiconductor module according to Embodiment 2 of the present invention.
Figure 8:
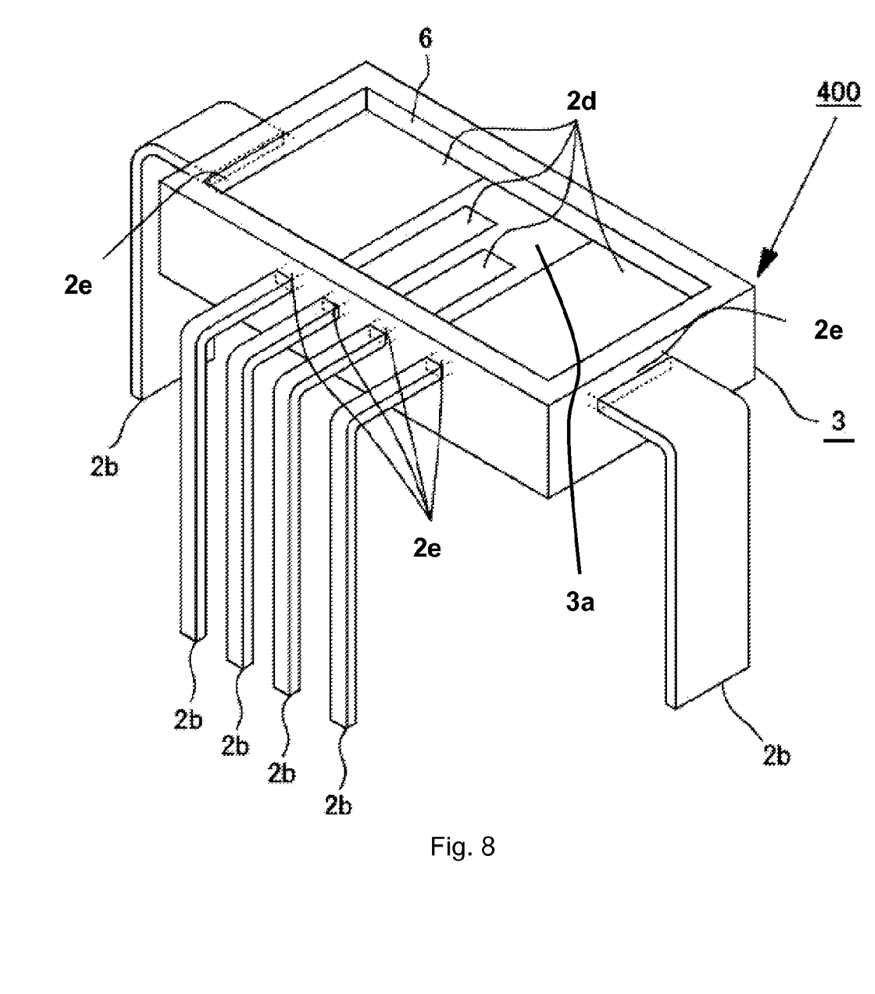
FIG. 8 is a perspective view showing the configuration of a modified example 2 of the power semiconductor module according to Embodiment 2 of the present invention.
Figure 9:
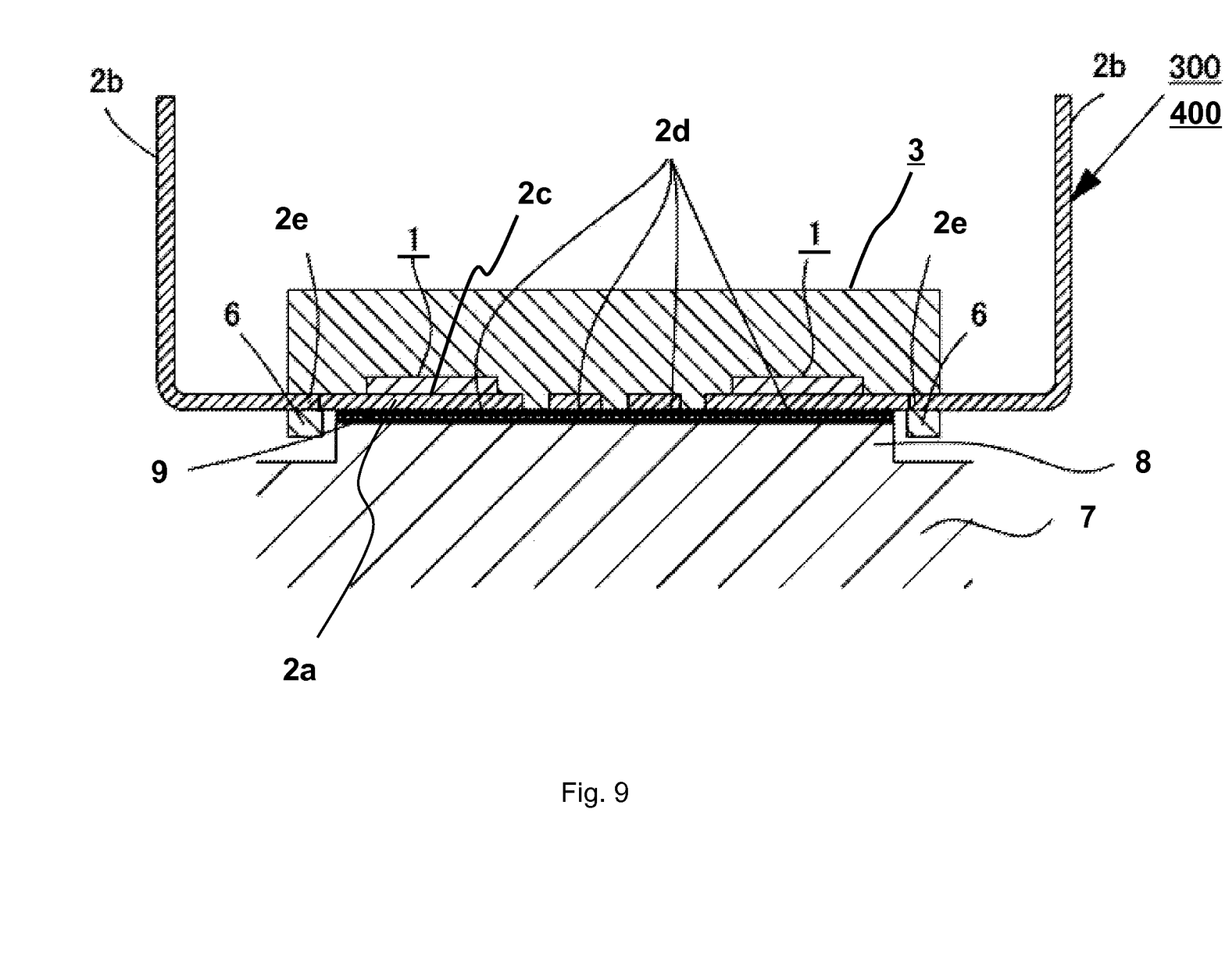
FIG. 9 is a sectional view of a power semiconductor module of FIG. 7 and FIG. 8.
Figure 10:
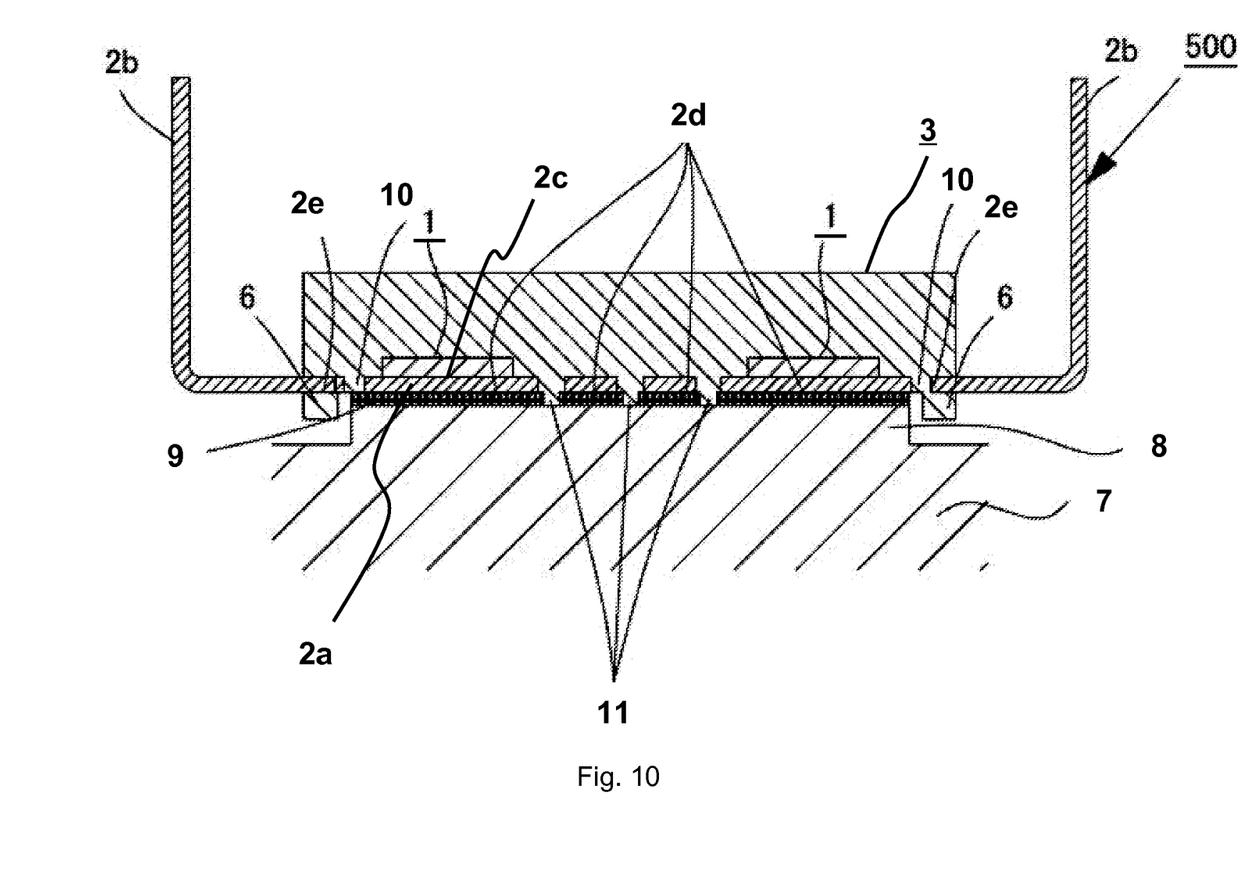
FIG. 10 is a sectional view showing the configuration of a modified example 3 of the power semiconductor module according to Embodiment 2 of the present invention.

FIG. 5 is a perspective view showing the configuration of a power semiconductor module according to Embodiment 2; and FIG. 6 is a sectional view taken along the line A-A of the power semiconductor module. Furthermore, FIG. 7 is a perspective view showing the configuration of a modified example 1 of the power semiconductor module according to Embodiment 2. Furthermore, FIG. 8 is a perspective view showing the configuration of a modified example 2 of the power semiconductor module according to Embodiment 2. Furthermore, FIG. 9 is a sectional view of the power semiconductor module of FIG. 7 and FIG. 8. In addition, FIG. 10 is a sectional view showing the configuration of a modified example 3 of the power semiconductor module according to Embodiment 2.

As shown in FIG. 5 and FIG. 6, in the power semiconductor module according to Embodiment 2, difference from the power semiconductor module of Embodiment 1 shown in FIG. 1 and FIG. 2 is configured such that a resin protrusion portion 6 is formed at an outer edge portion of the bottom 3a of a resin package 3 on the heat dissipation surface (exposed surface) 2d side of an electrode plate 2 and a base portion 2e of an external connection terminal portion 2b passes through the resin protrusion portion 6; and other constituent elements are similar to Embodiment 1 and therefore the description will be omitted.

Next, details and the effects of the configuration of the power semiconductor module according to Embodiment 2 will be described. As shown in a power semiconductor module 200 of FIG. 5 and FIG. 6, the resin protrusion portion 6 is formed along the outer edge portion of the resin package 3 to cover the base portion 2e of the external connection terminal portion 2b. The width d of the resin protrusion portion 6 is not particularly specified; however, the width d is preferable to be a width in which a part of the resin protrusion portion 6 covers an end portion of the heat dissipation surface 2d of the electrode plate 2 as shown in FIG. 5. In doing so, the base portion 2e of the external connection terminal portion 2b and a part of the end portion of the heat dissipation surface 2d of the electrode plate 2 are covered with the resin of the resin package 3; and therefore, it becomes possible to prevent the electrode plate 2 from peeling off from the resin package 3.

FIG. 7 is the sectional view showing the configuration of the modified example 1 of the power semiconductor module according to Embodiment 2. Furthermore, FIG. 8 is the perspective view showing the configuration of the modified example 2 of the power semiconductor module according to Embodiment 2. In a power semiconductor module 300 of FIG. 7, a plurality of resin protrusion portions 6 are formed intermittently so as to surround heat dissipation surfaces 2d along an outer edge portion of a resin package 3. Further, in a power semiconductor module 400 of FIG. 8, a resin protrusion portion 6 is formed continuously so as to surround heat dissipation surfaces 2d along an outer edge portion of a resin package 3.

In the power semiconductor module 200, 300, and 400 in the aforementioned Embodiment 2, the resin protrusion portion 6 protrudes with respect to the heat dissipation surface 2d of the electrode plate 2. Accordingly, as shown in the power semiconductor module according to Embodiment 2 of FIG. 5 and FIG. 7 and the sectional view (FIG. 9) of the modified example 1 thereof, in a heat sink 7 to be assembled to the power semiconductor module 300 or 400, the surface of the heat sink 7 to be bonded to the heat dissipation surfaces 2d via a heat dissipation intermediate member 9 needs to be raised one step. If, in the configuration of the modified example 1 and the modified example 2 of FIG. 7 and FIG. 8, the resin protrusion portion 6 formed so as to surround the heat dissipation surfaces 2d is fitted to a convex portion 8 of the heat sink 7; and therefore, when the heat sink 7 is assembled, the heat sink 7 is not misaligned back and forth and around, and there is few concern that the heat sink 7 is misaligned due to vibration or the like during use. This enables the heat dissipation surfaces 2d to come into contact with the heat sink 7 surely via the heat dissipation intermediate member 9, and heat dissipation properties can be secured.

FIG. 10 is the sectional view showing the configuration of the modified example 3 of the power semiconductor module according to Embodiment 2. In the case of assembling a heat sink 7 to a power semiconductor module 500 of FIG. 10, a through hole 10 is formed in a body portion 2a of an electrode plate 2 in the thickness direction thereof, the body portion 2a being covered with a resin package 3. Furthermore, resin of the resin package 3 is also embedded inside the through hole 10. An arrangement place and the number of the through holes 10 are not particularly specified; however, the through hole is preferable to be formed near a base portion 2e of an external connection terminal portion 2b. Further, the entire or a part of the through holes 10 is preferable to be formed at a place covered with a resin protrusion portion 6.

The resin is embedded in the through hole 10; and therefore, a bite of the electrode plate 2 to the resin package 3 can be enhanced. This makes a bitten part to act as an anchor even when peel-off occurs at the base portion 2e of the external connection terminal portion 2b at the worst; and thus, the development of the peel-off of the electrode plate 2 can be prevented and internal components can be prevented from being damaged.

Furthermore, the through hole 10 is formed at the position of the resin protrusion portion 6; and therefore, the through hole 10 acts as a flow path of the resin of the resin package 3 during transfer molding. This improves filling properties of the resin of the resin package 3 to the resin protrusion portion 6. The resin protrusion portion 6 is an elongated shape as shown in FIG. 5 and most of the resin protrusion portions 6 are divided from other portions by the body portions 2a of the electrode plates 2; and therefore, in the case of transfer molding, the resin of the resin package 3 is difficult to be filled from the semiconductor chip 1 sides of the electrode plates 2 to the resin protrusion portions 6. As a result, there is a concern that the shape of the resin protrusion portion 6 is incomplete. Furthermore, even if the shape is not incomplete, the resin is filled after progressing curing reaction of the resin; and accordingly, a problem exists in that contact properties between the resin package 3 and the body portion 2a of the electrode plate 2 is degraded. The flow paths of the resin are increased by forming the through holes 10; and thus, the filling properties of the resin to the resin protrusion portions 6 are improved and the above problem can be solved.

Incidentally, in the power semiconductor module 500 of FIG. 10, a spacer 11 made of the same resin as the resin package 3 is formed at a gap between the heat dissipation surfaces 2d. The height of the spacer 11 is set to the thickness of the heat dissipation intermediate member 9. This makes it possible to control the thickness of the heat dissipation intermediate member 9 when the power semiconductor module 500 is assembled to the heat sink 7 and it is possible to prevent failure in which the heat dissipation intermediate member 9 is too thin and accordingly the heat dissipation surface 2d comes into contact with the heat sink 7 to be electrically short-circuited. Incidentally, as shown in FIG. 7, if the resin protrusion portions 6 are intermittently formed, excess resin is exhausted from a gap between the resin protrusion portions 6 even when the heat dissipation intermediate member 9 is coated in a large amount. Consequently, there is an advantage in that control of the amount of coating also becomes easy.

As described above, in the power semiconductor module of Embodiment 2, the base portion of the external connection terminal portion is coated with the resin of the resin package over the entire periphery. Consequently, there are remarkable effects in that, in addition to the effects of the reduction in size and the improvement in heat dissipation properties which are obtained by the power semiconductor module of Embodiment 1, contact properties between the base portion of the external connection terminal portion and the resin package can be further improved; and therefore, the peel-off of the electrode plate is difficult to be occurred and corrosion of the electrode of the semiconductor chip generated in connection with the peel-off and the damage of internal components such as the semiconductor chip can be further reduced.

Embodiment 3.

Figure 11:
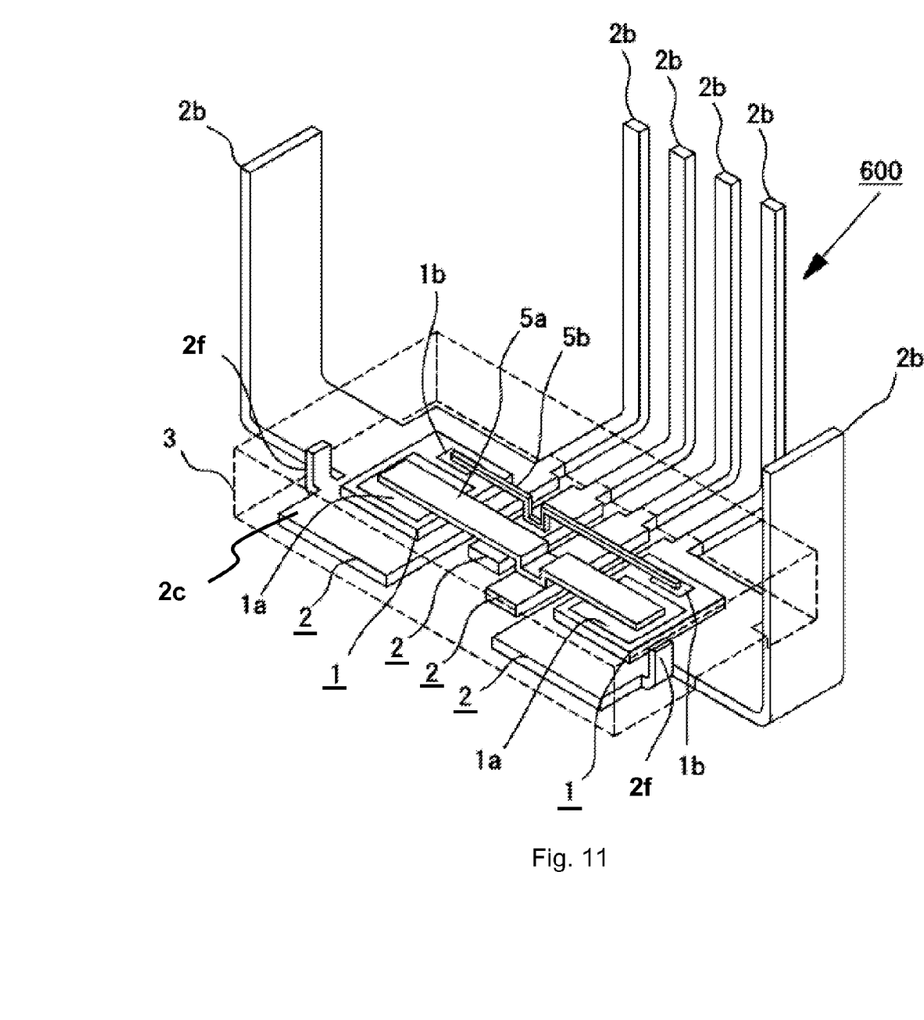
FIG. 11 is a perspective view showing the configuration of a power semiconductor module according to Embodiment 3 of the present invention.

FIG. 11 is a perspective view showing the configuration of a power semiconductor module according to Embodiment 3.

As shown in FIG. 11, in the power semiconductor module of Embodiment 3, difference from the power semiconductor module of Embodiment 1 shown in FIG. 1 and FIG. 2 is that a part of edge portions of an electrode plate 2 is provided with a claw 2f that is formed by being bent on the mounting surface 2d side of a semiconductor chip 1; and other constituent elements are similar to Embodiment 1 and therefore the description will be omitted.

Next, the configuration and effects of the power semiconductor module in Embodiment 3 will be described. As shown in FIG. 11, in this case, a part of each edge portion of two outermost electrode plates 2 each mounted with the semiconductor chip 1 is formed with the claw 2f that is bent on the mounting surface 2d side of the semiconductor chip 1. The bent shape, the number, the arrangement, and the like of the claw 2f are not particularly specified; however, as for the arrangement, the claw 2f is preferable to be formed near a base portion 2e of an external connection terminal portion 2b. The electrode plate 2 bites a resin package 3 and contact properties can be improved by forming the claw 2f; and therefore, the effect of suppressing the occurrence and the development of peel-off can be further enhanced and a highly reliable power semiconductor module can be obtained.

As described above, in the power semiconductor module of Embodiment 3, a part of the edge portion of the electrode plate is formed with the claw that is bent on the mounting surface side of the semiconductor chip. Consequently, there are remarkable effects in that, in addition to the effects of the reduction in size and the improvement in heat dissipation properties which are obtained by the power semiconductor module of Embodiment 1, a bite of the electrode plate to the resin package is further enhanced and contact properties are improved; and therefore, peel-off of the electrode plate is difficult to be occurred, the occurrence and the development of the peel-off can be prevented, and reliability can be further improved.

Embodiment 4.

Figure 12:
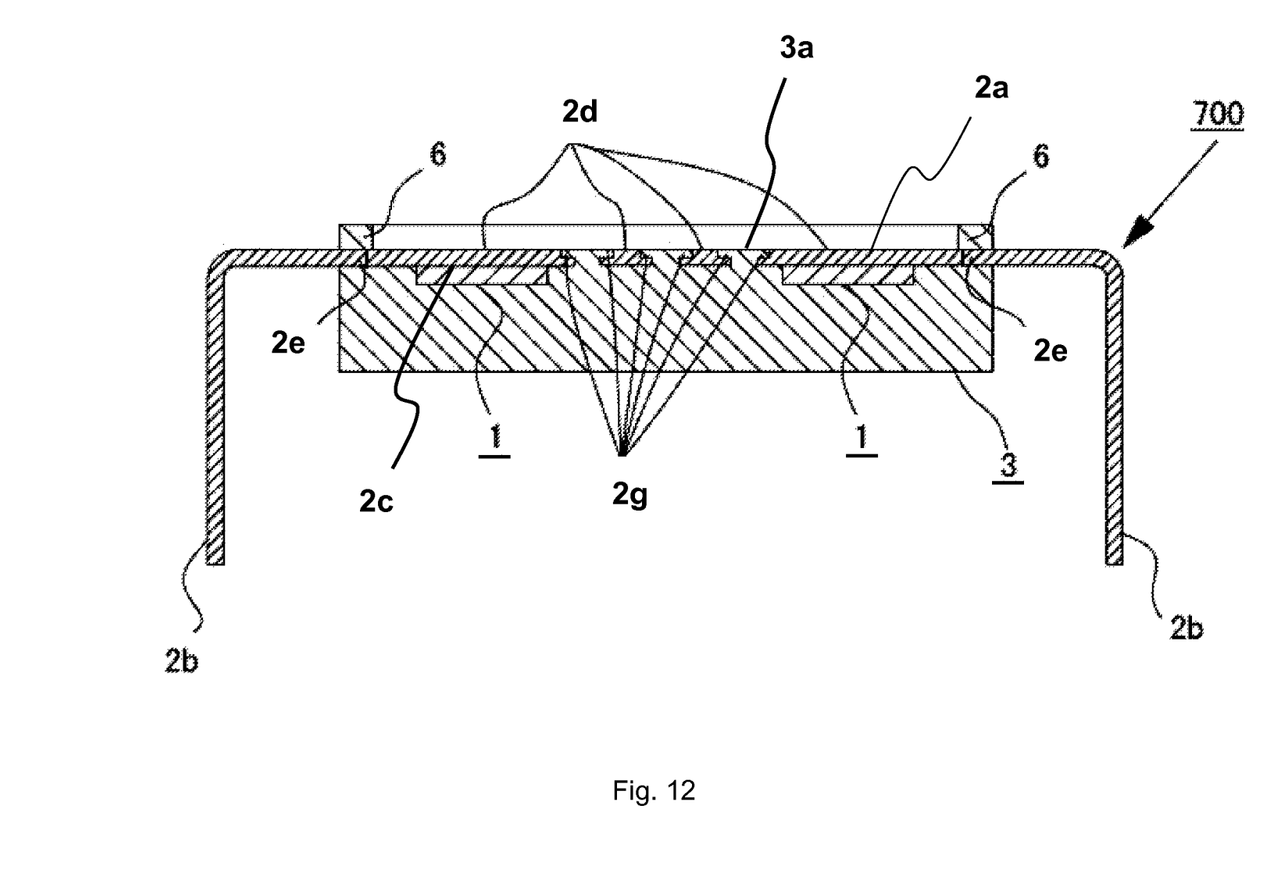
FIG. 12 is a sectional view showing the configuration of a power semiconductor module according to Embodiment 4 of the present invention.

FIG. 12 is a sectional view showing the configuration of a power semiconductor module according to Embodiment 4. Difference from the power semiconductor module of Embodiment 1 shown in FIG. 1 and FIG. 2 is that at least a part of an edge portion on the heat dissipation surface (exposed surface) side of a plurality of electrode plates is formed with a cutout portion that is cut out in a stepwise manner; and other constituent elements are similar to Embodiment 1 and therefore the description will be omitted.

Next, the configuration and effects of the power semiconductor module in Embodiment 4 will be described. As shown in FIG. 12, a cutout portion 2g, which is cut out in a stepwise manner over a part of or the entire periphery of an edge portion on the heat dissipation surface 2d side of an electrode plate 2, is formed and the cutout portion 2g is filled with resin of a resin package 3. Consequently, a tip portion of the edge portion on the heat dissipation surface 2d side of the electrode plate 2 is embedded in the resin package 3 and contact properties between the electrode plate 2 and the resin package 3 are improved.

Furthermore, a surface mounted with a semiconductor chip 1 on the opposite surface side of the cutout portion 2g of the electrode plate 2 is substantially a flat shape except for a slight embossment appeared when the cutout portion 2g is formed by press working. Consequently, the manufacturing process of assembling internal components such as the semiconductor chip 1 becomes easy. For example, solder paste is used as a connection member of the semiconductor chip 1; and in a supplying process by a screen printing method, the mounting surface of the electrode plate 2 mounted with the semiconductor chip 1 is flat; and therefore, a screen mask can be attached firmly and control of the printing thickness of the solder paste becomes easy.

As described above, in the power semiconductor module of Embodiment 4, the cutout portion is formed, the cutout portion being cut out in a stepwise manner over a part of or the entire periphery of the edge portion on the heat dissipation surface side of the electrode plate. Consequently, there are remarkable effects in that, in addition to the effects of the reduction in size and the improvement in heat dissipation properties which are obtained by the power semiconductor module of Embodiment 1, the tip portion of the edge portion of the electrode plate is embedded in the resin package by forming the stepwise cutout portion; and therefore, contact properties between the electrode plate and the resin package is further improved and the effect of peel-off suppression can be further enhanced.

Incidentally, the above described embodiments are merely exemplifications of the embodiments of the present invention, and alterations may be appropriately made or the above embodiments may be combined in adherence with the spirit of the present invention.

Furthermore, in the above embodiments, the relay circuit using the MOSFET chip is used as the semiconductor chip; however, a power semiconductor module having other circuit function may be permissible. For example, a three phase bridge inverter circuit for a three phase rotary machine may be permissible or a power semiconductor module constituting a part of an inverter circuit may be permissible.

Moreover, in the above embodiments, the semiconductor chip is not limited to a power MOSFET chip; but, a power semiconductor chip such as an insulated gate bipolar transistor (IGBT) chip may be permissible.

Additionally, in the above embodiments, the description has been made on the case where the semiconductor chip is molded as an electronic chip that is to be molded in a resin package of the power semiconductor module; however, a case where not only the semiconductor chip but also chip capacitors and resistors are also molded together in the resin package may be permissible.

In addition, the power semiconductor modules described in the above embodiments are suitable for one which is used by being incorporated in a vehicular rotary electric machine. The power semiconductor module of the above embodiments is reduced in size; and therefore, such a power semiconductor module can contribute to a reduction in size of a rotary electric machine to be mounted in a limited space like an automobile. Further, this is because, even if a force, which peels off the external connection terminal portion from the resin package by vibration due to driving and rotation during use, is generated, contact properties are improved and therefore failure occurred by such a force can be reduced.

Besides, the same reference numerals as those shown in the drawings represent the same or corresponding elements.

DESCRIPTION OF REFERENCE NUMERALS 100, 110, 200, 300, 400, 500, 600, and 700 Power semiconductor module
1 Semiconductor chip
2 Electrode plate
2a Body portion
2b External connection terminal portion
2c Mounting surface
2d Heat dissipation surface (Exposed surface)
2e Base portion
2f Claw
2g Cutout portion
3 Resin package
5, 5a, and 5b Lead
6 Resin protrusion portion
10 Through hole
11 Spacer

The invention claimed is:
1. A power semiconductor module comprising:
a plurality of electrode plates, each of the plurality of electrode plates having an external connection terminal portion integrally formed with a body portion, and the body portion of each of the plurality of electrode plates is arranged on a same flat surface;

a semiconductor chip mounted on and electrically connected to a first surface of the body portion of one of the plurality of electrode plates; and a resin package in which at least a part of a second surface of the body portion of said one of the plurality of electrode plates is exposed as an outer surface of the power semiconductor module, and the body portion of said one of the plurality of electrode plates and said semiconductor chip on the first surface are sealed with resin, wherein the external connection terminal portion extends outside the resin package along the same flat surface.

2. The power semiconductor module according to claim 1, wherein a width of the external connection terminal portion is narrower than a width of the body portion of said one of the plurality of electrode plates.

3. The power semiconductor module according to claim 2, wherein the exposed second surface of the body portion of said one of the plurality of electrode plates forms a bottom surface of said resin package, and a periphery of a base portion of the external connection terminal portion is covered with resin except for the same surface as the exposed second surface of the body portion of said one of the plurality of electrode plates.

4. The power semiconductor module according to claim 3, wherein the body portion of said one of the plurality of electrode plates is formed with a through hole, and the resin of said resin package is also filled in the through hole.

5. The power semiconductor module according to claim 2, wherein the exposed second surface of the body portion of said one of the plurality of electrode plates forms a bottom surface of said resin package except for an outer edge portion of the bottom; and the outer edge portion of the bottom of said resin package is formed with a resin protrusion portion continuously or intermittently, and a base portion of the external connection terminal portion passes through the resin protrusion portion.

6. The power semiconductor module according to claim 5, wherein the body portion of said one of the plurality of electrode plates is formed with through holes, and the resin of said resin package is also filled in the through holes, at least a part of the through holes being formed at a portion where resin of the resin protrusion portion is embedded.

7. The power semiconductor module according to claim 1, wherein a part of the body portion of said one of the plurality of electrode plates is formed with a claw that is bent.

8. The power semiconductor module according to claim 1, wherein at least a part of an edge portion on the exposed surface side of the body portion of said one of the plurality of electrode plates is formed with a cutout portion that is cut out in a stepwise manner, the cutout portion being filled with the resin of said resin package.

9. The power semiconductor module according to claim 1, wherein said power semiconductor module is incorporated in a vehicular rotary electric machine.

10. The power semiconductor module according to claim 1, wherein the first surface of the body portion of said one of the plurality of electrode plates and the second surface of the body portion of said one of the plurality of electrode plates have a substantially same surface area.

11. The power semiconductor module according to claim 1, wherein the second surface of the body portion of said one of the plurality of electrode plates is exposed to form a heat dissipation surface.

12. The power semiconductor module according to claim 1, wherein the resin package has a bottom surface having a recess, the recess being configured to accommodate the body portion of said one of the plurality of electrode plates, such that the second surface of the body portion of said one of the plurality of electrode plates is in a same plane as the bottom surface of the resin package.

* * * * *